United States Patent [19]

Crivello

[11] 4,161,405
[45] Jul. 17, 1979

[54] METHOD OF CATIONALLY POLYMERIZING OXIRANE FREE MATERIALS WITH GROUP VIA ONIUM SALTS

[75] Inventor: James V. Crivello, Elnora, N.Y.

[73] Assignee: General Electric Company, Schenectady, N.Y.

[21] Appl. No.: 822,150

[22] Filed: Aug. 5, 1977

Related U.S. Application Data

[60] Division of Ser. No. 638,981, Dec. 9, 1975, Pat. No. 4,058,400, which is a continuation of Ser. No. 466,373, May 2, 1974, abandoned.

[51] Int. Cl.² ............... G03C 5/00; G03C 1/94; G03C 5/04; C08J 3/28
[52] U.S. Cl. ............... 96/35.1; 96/86 P; 96/115 P; 96/115 R; 96/27 R; 427/54; 204/159.11; 204/159.14; 204/159.13; 204/159.17; 204/159.18; 204/159.23; 204/159.24
[58] Field of Search ............ 96/35.1, 86 P, 115 P, 96/115 R, 27 R; 204/159.19, 159.23, 159.24

[56] References Cited

U.S. PATENT DOCUMENTS

| | | | |
|---|---|---|---|
| 3,373,221 | 3/1968 | May | 260/837 |
| 3,458,311 | 7/1969 | Alles | 96/35.1 |
| 3,526,503 | 9/1970 | Dunham et al. | 96/33 |
| 3,567,453 | 3/1971 | Borden | 96/91 |
| 3,579,339 | 5/1971 | Chang et al. | 96/74 |
| 3,627,656 | 12/1971 | Miller et al. | 96/115 P |
| 3,729,313 | 4/1973 | Smith | 96/27 R |
| 3,901,705 | 8/1975 | Pazos | 96/115 P |

OTHER PUBLICATIONS

Knapczyk et al, J. Org. Chem., vol. 35, No. 8, (1970), pp. 2539-2543.
Maycock et al, J. Org. Chem., vol. 35, No. 8, (1970), pp. 2532-2538.
Kunieda et al., Polymer Letters Edition, vol. 12, pp. 395-397, (7/1974).

*Primary Examiner*—Jack P. Brammer
*Attorney, Agent, or Firm*—William A. Teoli; Joseph T. Cohen; Charles T. Watts

[57] ABSTRACT

Cationic polymerization of a variety of organic materials such as vinyl monomers, prepolymers, cyclic ethers, cyclic esters, cyclic sulfides and organosilicon cyclics can be achieved by the use of certain radiation sensitive aromatic onium salts of Group VIa elements. In addition, polymerizable compositions are provided which can be used as coating compounds, molding resins, adhesives, etc.

2 Claims, No Drawings

METHOD OF CATIONALLY POLYMERIZING OXIRANE FREE MATERIALS WITH GROUP VIA ONIUM SALTS

This aplication is a division of copending application Ser. No. 638,981, filed Dec. 9, 1975, now U.S. Pat. No. 4,058,400, which is a continuation of application Ser. No. 466,373, filed May 2, 1974, now abandoned.

Prior to the present invention, it was generally known that a variety of organic materials such as vinyl monomers possessing a high electron density in the double bond, were subject to cationic polymerization. A small amount of Lewis Acid catalyst, such as $SnCl_4$, $SbF_5$, $AsF_5$, etc. readily polymerize vinyl monomers such as styrene, butadiene, vinyl alkyl ethers, etc. It is often difficult, however, to generate the Lewis Acid catalyst at the appropriate time for polymerization, or have it properly dispersed throughout the vinyl monomer to achieve uniform results.

Additional organic materials such as aldehydes, cyclic ethers and cyclic esters also can undergo cationic polymerization from trace amounts of Lewis Acids. Such materials when properly catalyzed can be employed in coating applications, as encapsulants, etc. However, optimum results cannot be achieved because it is difficult to achieve dispersion or generation of the Lewis Acid in a desirable manner. A further description of the principles by which cationic polymerization of the above described organic materials can be achieved with Lewis Acids is described in *Principles of Polymer Chemistry*, pp 217-222 by P. J. Flory, Cornell University Press, Ithica, N.Y. (1953), and *Polymer Reviews* by J. Furukawa and T. Saegusa, Interscience Publishers, New York (1953). Another class of materials which undergoes cationic polymerization in the presence of Lewis Acids is organosilicon cyclics as shown by W. Noll, *The Chemistry and Technology of Silicones*, pp 219-226, Acedemic Press, New York (1968).

Improved methods of generating the Lewis Acids to effect polymerization of organic materials can be achieved by using heat sensitive Lewis Acid-tertiary amine complexes, such as complexes of boron trifluoride-tertiary amine. Although improved pot life can be obtained by such tertiary amine complexes, elevated temperatures such as up to 160° C. and substantially long cure times render such methods unsuitable for continuous cures or for the manufacture of delicate electronic devices. In addition, volatile monomers cannot be used due to the high temperatures used to activate the catalyst.

Schlesinger U.S. Pat. No. 3,708,296, or Watt U.S. Pat. No. 3,794,576 describe methods of releasing Lewis Acid catalysts by the use of radiation sensitive aromatic diazonium salts. Although actinic irradiation substantially minimizes the disadvantages of heat cure, the pot life of the polymerizable mixture during the shelf period is often unsatisfactory, particularly under daylight conditions. As a result, a stabilizer must be used to prolong the shelf period of the polymerizable mixture. Nitrogen is also generated during cure which can render the product unsuitable in a variety of applications.

The present invention is based on the discovery that certain photosensitive aromatic onium salts of Group VIa elements, as illustrated by the formula,

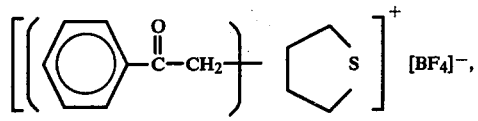

can be a source of Lewis Acid, such as boron trifluoride, phosphorous pentafluoride, arsenic pentafluoride, etc., when exposed to radiant energy. A variety of radiation polymerizable compositions are provided by incorporating the photosensitive aromatic onium salt into a variety of cationically polymerizable organic materials as defined below. Unlike curable compositions containing the above described diazonium salts, the polymerizable compositions of the present invention, which can be in the form of a solid or liquid, do not require a stabilizer. Even after extended shelf periods under normal daylight conditions, the polymerizable compositions of the present invention do not exhibit any significant change in properties. In addition, there is no problem with bubbling as characterized by organic resin compositions containing diazonium salts.

The aromatic onium salts of Group VIa elements utilized in the polymerizable compositions of the present invention can be more particularly defined by the following formula,

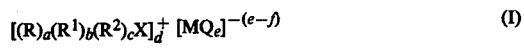

where R is a monovalent aromatic organic radical, $R^1$ is a monovalent organic aliphatic radical selected from alkyl, cycloalkyl and substituted alkyl, $R^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, d=e−f f=valence of M and is an integer equal to from 2 to 7 inclusive e is >f and is an integer having a value up to 8.

Radicals included by R are, for example, $C_{(6-13)}$ aromatic hydrocarbon radicals such as phenyl, tolyl, napthyl, anthryl, and such radicals substituted with up to 1 to 4 monovalent radicals such as $C_{(1-8)}$ alkoxy, $C_{(1-8)}$ alkyl, nitro, chloro, hydroxy, etc.; arylacyl radicals such as benzyl, phenylacyl, etc.; aromatic heterocyclic radicals such as pyridyl, furfuryl, etc. $R^1$ radicals include $C_{(1-8)}$ alkyl and substituted alkyl such as $-C_2H_4OCH_3$, $-CH_2COOC_2H_5$, $-CH_2COCH_3$, etc. $R^2$ radicals include such structures as

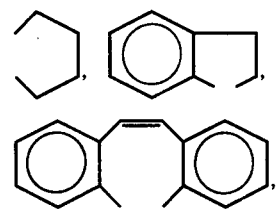

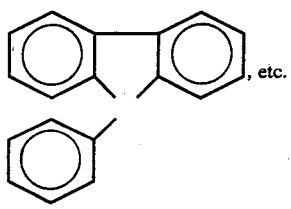

Complex anions included by $MQ_3^{-(e-f)}$ of formula I are, for example, $BF_4^-$, $PF_6^-$, $AsF_6^-$, $SbF_6^-$, $FeCl_4^-$, $SnCl_6^-$, $SbCl_6^-$, $BiCl_5^=$, $AlF_6^{-3}$, $GaCl_4^-$, $InF_4^-$, $TiF_6^=$, $ZrF_6^-$, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P, As, etc.

Group VIa onium salts included by Formula I are, for example,

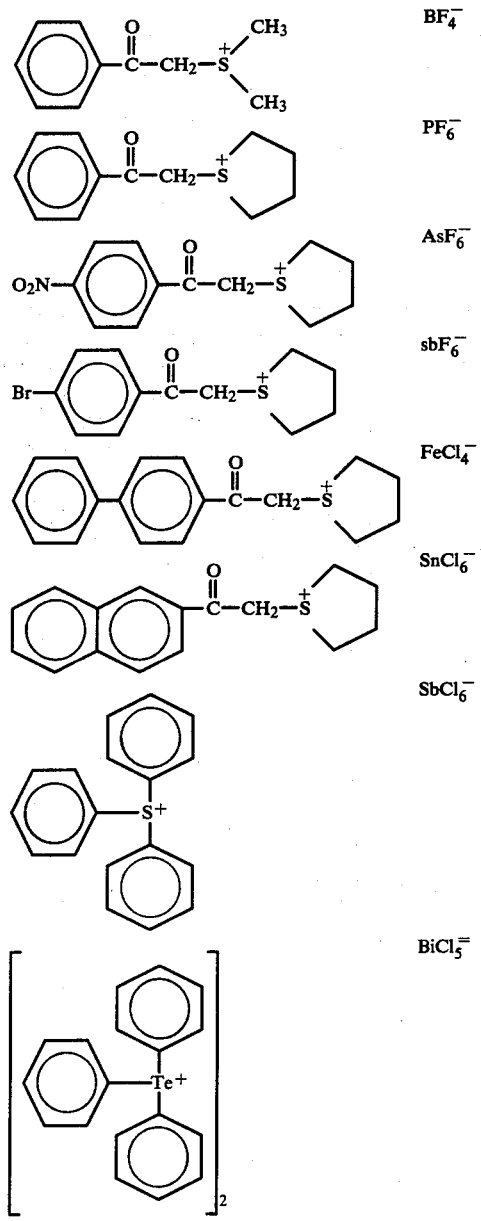

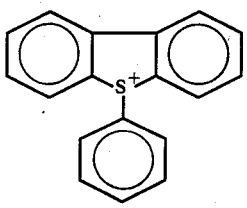

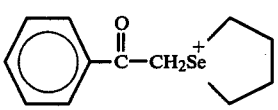

There is provided by the present invention, polymerizable compositions comprising, (A) a monomeric or prepolymeric cationically polymerizable organic material free of oxirane oxygen selected from vinyl organic monomers, vinyl organic prepolymers, cyclic organic ethers, cyclic organic esters, cyclic organic amines, organic silicon cyclics and cyclic organic sulfides, and (B) an effective amount of a radiation sensitive aromatic onium salt of a Group VIa element capable of effecting the polymerization of (A) by release of a Lewis Acid catalyst when exposed to radiant energy.

Group VIa onium salts of formula I are well known and can be made by the procedure shown in J. W. Knapczyk and W. E. McEwen, J. Am. Chem. Soc., 91, 145, (1969); A. L. Maycock and G. A. Berchtold, J. Org. Chem. 35, No. 8, 2532 (1970); H. M. Pitt, U.S. Pat. No. 2,807,648, E. Goethals and P. De Radzetzky, Bul. Soc. Chim. Belg., 73, 546 (1964); H. M. Leicester and F. W. Bergstrom, J. Am. Chem. Soc., 51, 3587 (1929), etc.

Included by the vinyl organic monomers which can be used in the practice of the invention to make the polymerizable compositions convertible to thermoplastic polymers are, for example, styrene, vinyl acetamide, α-methyl styrene, isobutyl vinylether, n-octyl vinylether, acrolein, 1,1-diphenylethylene, β-pinene; vinyl arenes such as 4-vinyl biphenyl, 1-vinyl pyrene, 2-vinyl fluorene, acenaphthylene, 1 and 2-vinyl naphthylene; 9-vinyl carbazole, vinyl pyrrolidone, 3-methyl-1-butene; vinyl cycloaliphatics such as vinylcyclohexane, vinylcyclopropane, 1-phenylvinylcyclopropane; dienes such as isobutylene, isoprene, butadiene, 1,4-pentadiene, etc.

Some of the vinyl organic prepolymers which can be used to make the polymerizable compositions of the present invention are, for example, $CH_2=CH-O-(CH_2-CH_2O)_n-CH=CH_2$, where n is a positive integer having a value up to about 1000 or higher; multi-functional vinylethers, such as 1,2,3-propane trivinyl ether, trimethylolpropane trivinyl ether, prepolymers having the formula, $$\left\{ \begin{array}{c} \phantom{x} \\ -\phantom{X}\!\!\!\!\!\bigcirc\!\!\!\!\!\phantom{X}-CH_2- \\ CH=CH_2 \end{array} \right\}_n ,$$

low molecular weight polybutadiene having a viscosity of from 200 to 10,000 centipoises at 25° C., etc. Products resulting from the cure of such compositions can be used as potting resins, crosslinked coatings, printing inks, etc.

A further category of the organic materials which can be used to make polymerizable compositions are cyclic ethers which are convertible to thermoplastics. Included by such cyclic ethers are, for example, oxetanes such as 3,3-bischloromethyloxetane, alkoxyoxetanes as shown by Schroeter U.S. Pat. No. 3,673,216, assigned to the same assignee as the present invention; oxolanes such as tetrahydrofuran, oxepanes, oxygen containing spiro compounds, trioxane, dioxolane, etc.

In addition to cyclic ethers there are also included cyclic esters such as β-lactones, for example, propiolactone, cyclic amines, such as 1,3,3-trimethylazetidine and organosilicon cyclics, for example, materials included by the formula,

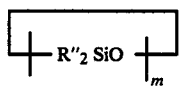

where R″ can be the same or different monovalent organic radicals such as methyl or phenyl and m is an integer equal to 3 to 8 inclusive. An example of an organosilicon cyclic is hexamethyl trisiloxane, octamethyl tetrasiloxane, etc. The products made in accordance with the present invention are high molecular weight oils and gums.

The polymerizable compositions of the present invention can be used as molding compounds, adhesives, printing inks, caulks, etc.

In particular instances, depending upon the compatability of the onium salt with the organic material, the onium salt can be dissolved or dispersed in an organic solvent such as nitromethane, methylene chloride, acetonitrile, etc., prior to its incorporation into the organic material. Experience has shown that the proportion of onium salt to organic material can vary widely inasmuch as the salt is substantially inert, unless activated. Effective results can be achieved, for example, if a proportion of from 0.1% to 15% by weight of onium salt is employed, based on the weight of polymerizable composition. Higher or lower amounts can be used, however, depending upon factors such as the nature of organic material intensity of radiation, polymerization time desired, etc.

It has been found that the onium salts of formula I also can be generated in situ in the presence of the organic material if desired. For example, an onium salt of the formula, $$(R)_1(R^1)_b(R^2)_cX^+Q', \quad (II)$$

where R, $R^1$, $R^2$, X, a, b and c are as previously defined, and Q' is an anion such as $Cl^-$, $Br^-$, $I^-$, $F^-$, $HSO_4^-$, and $NO_3^-$, etc. can be separately or simultaneously introduced into the organic material with a Lewis Acid of the formula,

M'(MQ)

where M and Q are as previously defined and M' is an alkali metal, for example, Na, K, etc., alkaline earth, such as Ca, Mg and organic bases such as quaternary ammonium, pyridinium, etc.

The polymerizable compositions may contain inactive ingredients such as silica fillers, dyes, extenders, viscosity control agents, process aids, etc. in amounts of from up to 100 parts filler per 100 parts of organic material.

Polymerization can be achieved by activating the onium salt to provide the release of the Lewis Acid catalyst. Activation of the onium salt can be achieved by heating the composition at a temperature in the range of from 150° C. to 250° C. Preferably cure can be achieved by exposing the curable composition to radiant energy such as electron beam or ultraviolet light. Electron beam cure can be effected at an accelerator voltage of from about 100 to 1000 KV. Polymerization composition is preferably achieved by the use of UV irradiation having a wavelength of from 1849 Å to 4000 Å. The lamp systems used to generate such radiation can consist of ultraviolet lamps such as from 1 to 50 discharge lamps, for example, xenon, metallic halide, metallic arc, such as a low, medium or high pressure mercury vapor discharge lamp, etc. having an operating pressure of from a few millimeters to about 10 atmospheres, etc., can be employed. The lamps can include envelopes capable of transmitting light of a wavelength preferably of 2400 Å to 4000 Å. The lamp envelope can consist of quartz, such as Spectrocil or Pyrex, etc. Typical lamps which can be employed for providing ultraviolet radiation are, for example, medium pressure mercury arcs, such as the GE H3T7 arc and the Hanovia 450 W arc lamp. The cures may be carried out with a combination of various lamps, some or all of which can operate in an inert atmosphere. When using UV lamps, the irradiation flux in the substrate can be at least 0.01 watts per square inch to effect polymerization of the organic material within 1 to 20 seconds and permit the cure to be carried on continuously as, for example, in the curing of a multifunctional vinyl ether coated steel strip or paper web to be taken up at a rate of from 100 to 600 feet per minute. The strip can be cut to a predetermined width for use as printed material. A combination of heat and light may be used to cure reactive compositions. Such a combination of heat and light may serve to reduce the overall cure time.

In order that those skilled in the art will be better able to practice the invention, the following examples are given by way of illustration and not by way of limitation. All parts are by weight.

EXAMPLE 1

There was added under a nitrogen atmosphere, 0.2 part of triphenyl sulfonium hexafluorophosphate to 39 parts of tetrahydrofuran. The mixture was then exposed to ultraviolet irradiation from a Hanovia lamp. The mixture was irradiated for 10 minutes and the polymerization mixture was allowed to stand for four hours. There was obtained a tough polymer having an intrinsic viscosity of 3.7 dl/g in benzene at 25° C. The polymer was fabricated into an exceedingly tough elastic film with the use of heat and pressure.

EXAMPLE 2

Triphenylselenonium chloride was prepared according to the procedure of H. M. Leicester and F. W. Bergstrom, J. Am. Chem. Soc., 51, 3587 (1929) starting with diphenyl selenide. The corresponding fluoroborate, hexafluoroarsenate and hexafluoroantimonate salts were prepared by adding sodium hexafluoroarsenate, sodium tetrafluoroborate and potassium hexafluoroantimonate, respectively, to an aqueous solution of triphenyl selenonium chloride. The products were white crystalline solids which were dried in vacuo.

Three percent solutions of the above salts in ethylene glycol divinyl ether were respectively cured as 2 mil films on steel panels at a distance of six inches from a GE H3T7 lamp. The following cure times were observed:

| Salt | Cure Time |
| --- | --- |
| $(C_6H_5)_3Se^+BF_4^-$ | 5 sec. |
| $(C_6H_5)_3Se^+AsF_6^-$ | 3 sec. |
| $(C_6H_5)_3Se^+SbF_6^-$ | 2 sec. |

The films formed on the steel panels are found to be acetone insoluble.

EXAMPLE 3

There were added 3 parts of sodium hexafluoroarsenate and 6 parts of a 50% solution of triphenylsulfonium chloride to 97 parts diethylene glycol divinyl ether. The mixture was stirred for several hours at room temperature, allowed to settle and an aliquot of the solution was removed by means of a pipet. The sensitized solution was knife coated onto a 3 in×6 in steel panel to give a 0.2 mil film and then cured as in Example 2. A hard clear coating was obtained in 3 seconds which could not be removed when rubbed with acetone. The coated steel could be used as a laminate for making transformers.

EXAMPLE 4

An aliquot of the solution prepared in Example 3 was coated onto glass to give a 1 mil film. A perforated mask was placed over the film and the assembly was irradiated for 5 seconds. After it was washed, the coated substrate was washed with isopropanol. A clear negative image of the mask remained as polymerized film.

Based on the above procedure, the curable composition can be employed as a negative photoresist in particular applications and for the fabrication of printing plates.

EXAMPLE 5

Glass cloth was impregnated with a mixture of 97 parts of diethylene glycol divinyl ether and 3 parts of triphenylsulfonium hexafluoroantimonate. Two 6 in×6 in squares of the impregnated glass cloth were stacked together and irradiated for 30 seconds on each side using the apparatus described in Example 2. The resulting hard and stiff laminate was found to be integrally bonded together. An additional 6 in×6 in square of impregnated cloth was added to the laminate. It also was cured after a 30 second exposure to ultraviolet light. The resulting laminate composed of three layers of glass cloth could be used for circuit board applications.

EXAMPLE 6

There was added 0.2 part of triphenylsulfonium hexafluorophosphate to a mixture composed of 8 parts dimethylcyclotrisiloxane and 2 parts of dimethylcyclotetrasiloxane. This mixture was then flushed with nitrogen. Polymerization was initiated by exposing the sensitized solution to ultraviolet irradiation from a Hanovia 450 watt lamp at a distance of 3 inches for 10 minutes. The mixture was removed from the irradiation and allowed to stand for one day. A highly viscous polymer mixture was obtained which was isolated by pouring the solution into methanol. There was obtained a viscous silicone oil useful for imparting improved surface characteristics to a variety of substrates.

EXAMPLE 7

There was added 0.3 part of triphenylsulfonium tetrafluoroborate to a mixture of 15 parts of trimethylolpropane trivinyl ether and 0.4 part of carbon black. The mixture was agitated for 3 hours on a ball mill and then used to print onto white paper. Exposure of the printed paper to ultraviolet light at a distance of 3 inches from a GE H3T7 lamp caused the printing to become dry within 1-2 seconds.

EXAMPLE 8

A mixture was prepared composed of 2% phenacyltetramethyl sulfonium fluoroborate, 97.5% ethylene glycol divinyl ether and 0.5% of a surface active agent. This mixture was stirred until homogeneous. It was then applied onto a 3 in×6 in steel panel using a drawblade having a 0.2 mil aperture. After exposing the applied mixture to ultraviolet radiation having an intensity of 200 watts/sq. in. for a period of 1 second, a hard film was obtained on the surface of the steel panel. The film could not be removed even though the panel was repeatedly dipped into acetone and rubbed with a cloth.

EXAMPLE 9

A (30:70) mixture of 1,2,3-propane trivinyl ether and diethylene glycol divinyl ether was sensitized with 3 parts of phenacyltetramethylene sulfonium fluoroborate. This mixture was coated onto a sheet of Lexan ® polycarbonate using a draw knife with a 0.2 mil aperture. The coating was cured for 5 seconds as described in Example 2. There was obtained a polycarbonate sheet having a transparent, scratch-resistant coating which could not be removed by rubbing with acetone.

EXAMPLE 10

A mixture of 0.1 part of triphenylsulfonium fluoroborate and a solution of 13.3 parts of recrystallized N-vinylcarbazole in 39 parts of methylene chloride was sealed under a nitrogen atmosphere. The mixture was irradiated for 10 minutes at a distance of 3 inches from a 450 watt Hanovia lamp while immersed in an ice bath. The mixture was then allowed to stand. Exothermic polymerization took place giving a highly viscous solution. After 3 hours, the polymer solution was poured into methanol. There was isolated after filtering, washing and drying, 13.0 parts of polyvinylcarbazole.

EXAMPLE 11

A polymerization mixture of 26.6 parts of freshly distilled styrene, 0.20 part of triphenylsulfonium hexafluoroarsenate and 6.5 parts of distilled methylene chloride, sealed under nitrogen, was irradiated for 10-15 minutes under a 450 watt Hanovia medium vapor pressure mercury lamp. Rapid exothermic polymerization took place and the polymerization was allowed to stand in the dark for 5 hours. The viscous reaction mixture was poured into methanol and the solid polymer was filtered and washed. A white polystyrene having an intrinsic viscosity of 0.16 dl/g in benzene was produced.

EXAMPLE 12

A mixture of 11.4 parts of α-methylstyrene, 0.11 part of triphenylsulfonium hexafluoroantimonate and 26 parts of methylene chloride was irradiated for 2.5 hours in accordance with the procedure of Example 11. The resulting highly viscous polymer solution was quenched by adding a small amount of methanol. A product isolated by pouring the solution into a large amount of methanol. After drying, there was obtained, 11.4 parts of polymerized α-methylstyrene which was useful as a molding resin.

EXAMPLE 13

A printing ink was prepared by mixing together 2.5 parts of glycerol trivinyl ether, 3 parts of 3,5-dimethyl-4-hydroxyphenyl dimethylsulfonium fluoroborate and 5 parts of a red fluorescent pigment. These components were used as an ink to print on white paper. The printed paper was exposed for 3 seconds to UV light resulting in a clear, dry, non-smearable printed image.

EXAMPLE 14

A mixture of 21.0 parts of N-vinylpyrrolidone and 0.63 parts of triphenylsulfonium fluoroborate was irradiated with a Hanovia lamp for 13 minutes. The solution became quite viscous and was allowed to stand in the dark for two days at room temperature. A polymer formed having an intrinsic viscosity of 0.29 in water.

EXAMPLE 15

A mixture of 9.2 parts of recrystallized trioxane, 26 parts of methylene chloride, and 0.06 part of triphenylsulfonium fluoroborate was irradiated for 1 hour in the presence of pyrex filtered UV light from a Hanovia lamp. A white powdery precipitate formed. The solution was then allowed to stand for 8 hours in the dark. The precipitated polymer was filtered and dried. There was obtained 7 parts of polyoxymethylene.

EXAMPLE 16

A solution of diethylene glycol divinyl ether containing 2% by weight triphenylsulfonium hexafluoroarsenate was coated onto a 3 in×6 in steel plate. A perforated mask was placed over the coating and this assembly was exposed to ultraviolet light using a GE H3T7medium pressure mercury arc lamp at a distance of four inches. After a 5 second exposure, the mask was removed and the plate was washed with i-propanol. A clear, raised negative image of the mask was formed.

Although the above examples are limited to only a few of the very many polymerizable compositions and uses thereof which are included within the scope of the present invention, it should be understood that the present invention is intended to cover a much broader class of such compositions and uses thereof. Those skilled in the art would also know that the polymerizable compositions also cover the use of onium polymers containing Group VIa onium functionality as part of the polymer backbone or in the pendant position.

What I claim as new and desire to secure by Letters Patent of the United States is:

1. A method for cationically polymerizing organic material free of oxirane oxygen consisting essentially of a monomeric or prepolymeric cationically polymerizable organic material free of oxirane oxygen selected from vinyl organic monomers, vinyl organic prepolymers, cyclic organic ethers, cyclic organic esters, cyclic organic sulfides, cyclic amines and organosilicon cyclics which comprises, (A) forming a mixture of such organic material and an effective amount of an aromatic onium salt of a Group VIa element having the formula,

(B) exposing said mixture of (A) to ultraviolet radiation, where R is a monovalent aromatic organic radical, $R^1$ is a monovalent organic aliphatic radical selected from alkyl, cyclialkyl and substituted alkyl, $R^2$ is a polyvalent organic radical forming a heterocyclic or fused ring structure selected from aliphatic radicals and aromatic radicals, X is a Group VIa element selected from sulfur, selenium and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, d=e−f f=valence of M and is an integer equal to from 2 to 7 inclusive e is >f and is an integer having a value up to 8.

2. A method for imparting an image on the surface of a substrate in accordance with claim 1, by (a) treating the substrate with the composition of step (A), (b) placing a mask over the treated substrate, (c) exposing the treated substrate to ultraviolet light, and (d) washing the substrate with a suitable solvent.